United States Patent
Maresh et al.

(10) Patent No.: US 12,044,739 B2
(45) Date of Patent: Jul. 23, 2024

(54) BATTERY STATE OF CHARGE MANAGEMENT FOR STORAGE

(71) Applicant: INTERNATIONAL BUSINESS MACHINES CORPORATION, Armonk, NY (US)

(72) Inventors: Mark E. Maresh, Oro Valley, AZ (US); Richard John Fishbune, Rochester, MN (US); Marc Henri Coq, Hopewell Junction, NY (US); Eric B. Swenson, Pine Island, MN (US)

(73) Assignee: International Business Machines Corporation, Armonk, NY (US)

( * ) Notice: Subject to any disclaimer, the term of this patent is extended or adjusted under 35 U.S.C. 154(b) by 497 days.

(21) Appl. No.: 17/303,402

(22) Filed: May 28, 2021

(65) Prior Publication Data
US 2022/0381834 A1    Dec. 1, 2022

(51) Int. Cl.
*G01R 31/382* (2019.01)
*G01R 31/36* (2020.01)
(Continued)

(52) U.S. Cl.
CPC ....... *G01R 31/382* (2019.01); *G01R 31/3646* (2019.01); *G01R 31/367* (2019.01);
(Continued)

(58) Field of Classification Search
CPC .......................... G01R 31/382; G01R 31/3646
(Continued)

(56) References Cited

U.S. PATENT DOCUMENTS

| 7,888,913 B1 | 2/2011 | Marty |
| 9,966,780 B2 | 5/2018 | Sherstyuk |
| (Continued) | | |

FOREIGN PATENT DOCUMENTS

| CN | 103579691 A | 2/2014 |
| CN | 205543142 U | 8/2016 |
| (Continued) | | |

OTHER PUBLICATIONS

Notification of Transmittal of The International Search Report and The Written Opinion of the International Searching Authority, or the Declaration, Applicants file reference: PF220331PCT, International Application No. PCT/CN2022/095228, Date of Mailing: Aug. 31, 2022, date of completion of search report: Aug. 9, 2022, International filing date: May 26, 2022, pp. 1-10.

(Continued)

*Primary Examiner* — Ricky Go
(74) *Attorney, Agent, or Firm* — Tihon Poltavets

(57) ABSTRACT

Embodiments of the present invention manage a state of charge of a rechargeable battery for extended storage by determining a manual override for a storage protocol is not activate for a rechargeable battery associated with a battery charger and an electronic device. Receiving battery data, environment data, and historical data for the rechargeable battery associated with a battery charger. Embodiments of the present invention determine to activate the storage protocol for the rechargeable battery based on the battery data, the environment data, and the historical data and discharge the rechargeable battery to a preset state of charge level based on the storage protocol.

20 Claims, 5 Drawing Sheets

(51) Int. Cl.
*G01R 31/367* (2019.01)
*H01M 10/44* (2006.01)
*H02J 7/00* (2006.01)

(52) U.S. Cl.
CPC ......... *H01M 10/44* (2013.01); *H02J 7/00032* (2020.01); *H02J 7/0069* (2020.01)

(58) Field of Classification Search
USPC .......................................................... 702/63
See application file for complete search history.

(56) References Cited

U.S. PATENT DOCUMENTS

| | | | |
|---|---|---|---|
| 10,804,574 B2 | 10/2020 | Clarke | |
| 10,903,534 B2 | 1/2021 | Singer | |
| 2005/0127875 A1 | 6/2005 | Hall | |
| 2013/0158913 A1* | 6/2013 | Ketkar | B60L 58/25 |
| | | | 702/63 |
| 2014/0101476 A1 | 4/2014 | Lu | |
| 2015/0329003 A1* | 11/2015 | Li | B60L 50/16 |
| | | | 320/134 |
| 2016/0266979 A1* | 9/2016 | Glover | G01R 31/3646 |
| 2017/0302095 A1 | 10/2017 | Flynn, Jr. | |
| 2020/0014230 A1* | 1/2020 | Zhang | H02J 7/007194 |
| 2020/0091734 A1* | 3/2020 | Odegaard | H02J 7/00302 |
| 2020/0395775 A1* | 12/2020 | Hayayama | H02J 7/00712 |

FOREIGN PATENT DOCUMENTS

| | | |
|---|---|---|
| CN | 108183521 A | 6/2018 |
| CN | 111224179 A | 6/2020 |
| DE | 102007056976 A1 | 5/2009 |

OTHER PUBLICATIONS

Ego Power Plus, "The World's First Self-Winding Line Trimmer", https://egopowerplus.co.uk/sites/default/files/2018-10/41891-EGO-Battery-FAQs_Interactive_AW_FINAL-compressed_0.pdf, accessed Feb. 23, 2021, pp. 1-74.

Mell et al., "The NIST Definition of Cloud Computing", National Institute of Standards and Technology, Special Publication 800-145, Sep. 2011, pp. 1-7.

* cited by examiner

BATTERY STATE OF CHARGE MANAGEMENT FOR STORAGE

BACKGROUND

This disclosure relates generally to battery management, and in particular to managing a state of charge of a battery for extended storage.

Rechargeable batteries represent a type of electrical battery capable of being charged, discharged into a load, and subsequent recharged utilizing an external power source or electrical generator, such as an alternator. Rechargeable batteries are widely utilized in applications across industrial and consumer products in varying environmental conditions. For long term storage, storing rechargeable batteries at a reduced state of charge level depending on environmental conditions can optimize a life of the rechargeable batteries.

SUMMARY

Embodiments in accordance with the present invention disclose a method, computer program product and computer system for managing a state of charge of a battery for extended storage, the method, computer program product and computer system can, responsive to determining a manual override for a storage protocol is not activate, receive battery data for a rechargeable battery associated with a battery charger. The method, computer program product and computer system can receive environment data for the rechargeable battery. The method, computer program product and computer system can receive historical data for the rechargeable battery. The method, computer program product and computer system can, responsive to determining to activate the storage protocol for the rechargeable battery based on the battery data, the environment data, and the historical data, discharge the rechargeable battery to a preset state of charge level based on the storage protocol.

DETAILED DESCRIPTION

Figure 1:
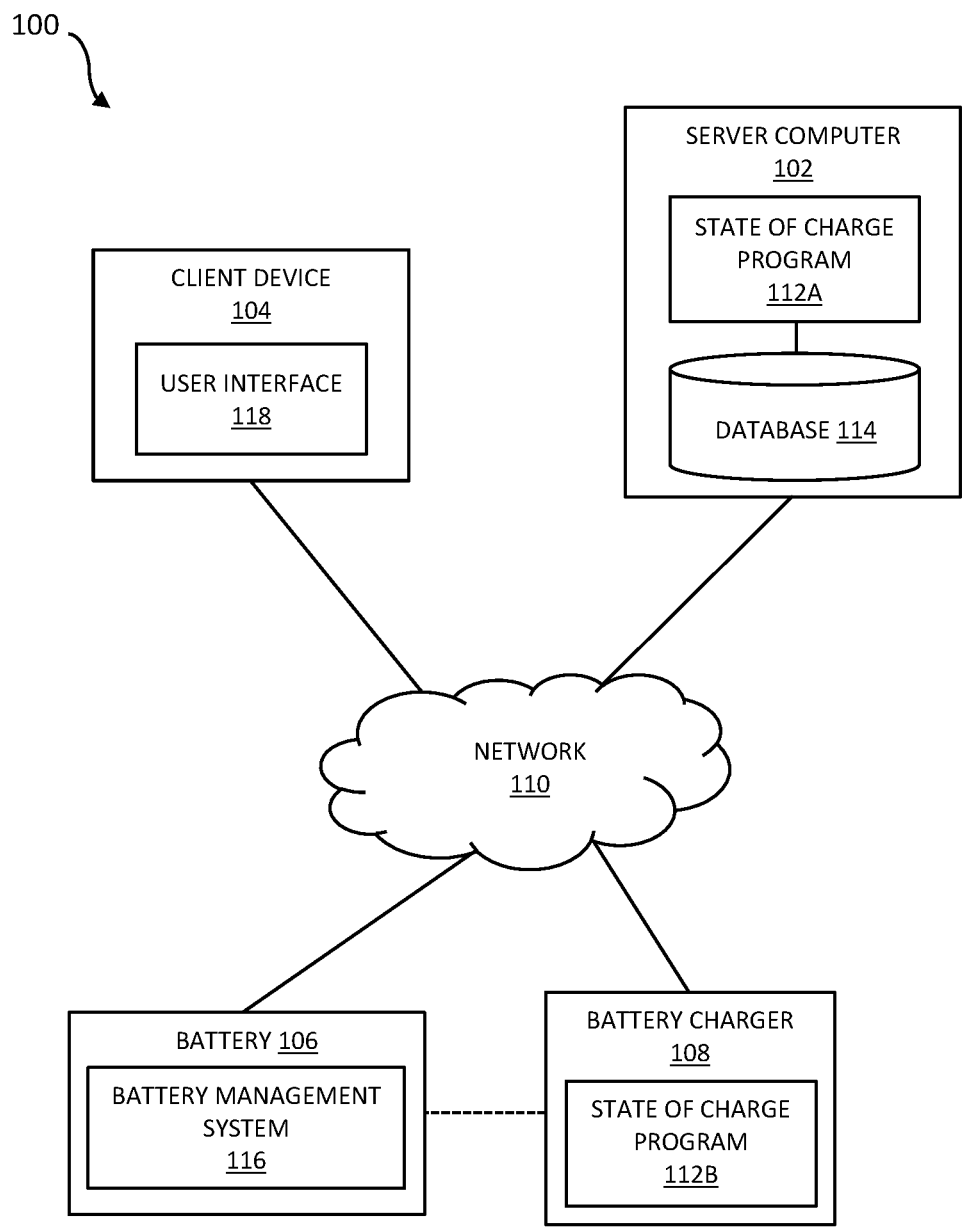
FIG. 1 is a functional block diagram illustrating a distributed data processing environment, in accordance with an embodiment of the present invention.

Embodiments of the present invention manage a state of charge of a rechargeable battery for extended storage. A battery charger associated with the battery includes a state of charge program for controlling a discharge of compatible batteries for long term storage via a network connection between the battery charger and the compatible batteries. The state of charge program utilizes various data including battery data, environmental data, and historical data to determine whether to initiate a storage protocol for the compatible batteries for long term storage. A discharge limit is utilized to maintain an optimal battery life of the compatible batteries based on a storage temperature. The state of charge program can initiate the storage protocol by sending a signal to the compatible battery regardless of location (e.g., loose, connected to the battery charger, installed in equipment) to slowly discharge to a preset limit utilizing an internal discharge function built into the battery management system of the compatible battery. Additionally, the state of charge program can prevent any future charging of the compatible battery until the storage protocol is manually overridden by a user.

The compatible battery and the battery charger are examples of internet of things (IoT) computing devices capable of wirelessly connecting to a network and transmitting data to other electronic device connected to the network. The compatible battery includes internal functions and circuity, typically as part of the battery management system, that allows for self-discharging to occur. A common method of discharging the compatible utilizes a combination of resistors, where a time to discharge is not relevant and the power dissipated by the resistor is small to reduce an amount of heat produced during the discharging. The compatible battery and battery charge are capable of communication with each other through a network connection, where the battery charger includes the state of charge program for managing the discharging of the compatible batteries for long term storage. The state of charge program can utilize an operational protocol for typical charging and discharging activates and a storage protocol for discharging the compatible batteries for long term storage.

As mentioned above, the state of charge program utilizes various battery data including battery data, environmental data, and historical data to determine whether to initiate a storage protocol for the compatible batteries for long term storage. In the event the state of charge program determines to initiate a storage protocol for a compatible battery by adjusting the state of charge level for long term storage, the state of charge program sends a signal to the compatible battery regardless of location to slowly discharge to a preset state of charge level (e.g., 25%). During the discharging of the compatible battery or subsequent to reaching the preset state of charge level, the state of charge program prevents any future charging of the compatible battery until the storage protocol is manually overridden by the user, even if the compatible battery is electrically coupled to the battery charger. The preset state of charge level is based on an ambient temperature for an environment in which the compatible battery resides. For example, if the ambient temperature is below a threshold, the preset state of charge level is higher than if the ambient temperature was at or above the threshold. Furthermore, if the ambient temperature increases during the long-term storage, the state of charge program can instruct the compatible battery to further discharge from a first preset state of charge level (e.g., 25%) to a second preset state of charge level (e.g., 15%). In some embodiments, the state of charge program can provide status updates for the compatible batteries to a client device associated with the user, where the user can reset a storage protocol and/or switch between an operational protocol and the storage protocol for the compatible batteries.

FIG. 1 is a functional block diagram illustrating a distributed data processing environment, generally designated 100, in accordance with one embodiment of the present invention. The term "distributed" as used herein describes a computer system that includes multiple, physically distinct devices that operate together as a single computer system.

FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment includes server computer 102, client device 104, battery 106, battery charger 108 interconnected over network 110. Server computer 102 can be a standalone computing device, a management server, a web server, a mobile computing device, or any other electronic device or computing system capable of receiving, sending, and processing data. In other embodiments, server computer 102 can represent a server computing system utilizing multiple computers as a server system, such as in a cloud computing environment. In another embodiment, server computer 102 can be a laptop computer, a tablet computer, a netbook computer, a personal computer (PC), a desktop computer, a smart phone, or any programmable electronic device capable of communicating with client device 104 and other computing devices (not shown) within the distributed data processing environment via network 110. In another embodiment, server computer 102 represents a computing system utilizing clustered computers and components (e.g., database server computers, application server computers, etc.) that act as a single pool of seamless resources when accessed within the distributed data processing environment. Server computer 102 includes server-side state of charge program 112A and database 114. Server computer 102 may include internal and external hardware components, as depicted and described in further detail with respect to FIG. 3.

Client device 104 can be a laptop computer, a tablet computer, a smart phone, smart watch, a smart speaker, or any programmable electronic device capable of communicating with various components and devices within the distributed data processing environment, via network 110. Client device 104 may be a wearable computer. Wearable computers are miniature electronic devices that may be worn by the bearer under, with, or on top of clothing, as well as in or connected to glasses, hats, or other accessories. Wearable computers are especially useful for applications that require more complex computational support than merely hardware coded logics. In general, client device 104 represents one or more programmable electronic devices or combination of programmable electronic devices capable of executing machine readable program instructions and communicating with other computing devices (not shown) within the distributed data processing environment via a network, such as network 110. In one embodiment, client device 104 represents one or more devices associated with a user. Client device 104 includes an instance of user interface 118 for interacting with state of charge program 112A on server computer 102 and/or state of charge program 112B on battery charger 108.

Battery 106 is a rechargeable battery capable of being charged, discharged into a load, and recharged utilizing an external power source or electrical generator. Battery 106 includes battery management system 116, where battery management system 116 is an electronic system that manages battery 106 by ensuring safe operational parameters are maintained, monitoring various operational states (e.g., operational protocol versus storage protocol), discharging to a state of charge preset level, determining secondary data, reporting the secondary data, controlling an internal environment (e.g., cooling fans), serial authentication, and load balancing across multiple cells of battery 106. In another embodiment, battery 106 does not include battery management system 116, but include internal circuitry (e.g., resistors) for discharging battery 106 while reducing an amount of heat produced during the discharging of battery 106.

Battery charger 108 is represents an electronic device capable of charging and discharging battery 106. Battery charger 108 includes a client-side state of charge program 112B for managing battery 106, where battery 106 is uninstalled (i.e., loose), installed within an electronic device, or electrically coupled to battery charger 108. Battery charger 108 can communicate with battery 106 via network 110 and/or a local network (e.g., Wi-Fi, Bluetooth®) independent from network 110. Client-side state of charge program 112B can communicate with server-side state of charge program 112A on server computer 102, where server-side state of charge program 112A performs the functional steps as described with respect to FIG. 2. In other embodiments, server-side state of charge program 112A and/or client-side state of charge program 112B performs the functional steps as described with respect to FIG. 2.

Network 110 can be, for example, a telecommunications network, a local area network (LAN), a wide area network (WAN), such as the Internet, or a combination of the three, and can include wired, wireless, or fiber optic connections. Network 110 can include one or more wired and/or wireless networks capable of receiving and transmitting data, voice, and/or video signals, including multimedia signals that include voice, data, and video information. In general, network 110 can be any combination of connections and protocols that will support communications between server computer 102, client device 104, battery 106, battery charger 108, and other computing devices (not shown) within the distributed data processing environment.

State of charge program 112 manages a state of charge by initially activating an operational protocol for battery 106, where the operation protocol represents a normal operational mode of battery 106 for charging and discharging a load into an associated electronic device. Responsive to state of charge program 112 determining a user defined manual override for a storage protocol is not active, state of charge program 112 receives battery data for battery 106 from database 114. Battery data can include but is not limited to a battery type, an electronic device (e.g., laptop, seasonal equipment, residential power storage) associated with the battery, age of battery, and one or more manufacturer handling instructions (e.g., avoid storage temperatures below 30° F. and exceeding 90° F.). State of charge program 112 also receives environment data for battery 106 from database 114, where the environment data includes environmental information in which battery 106 resides. The environmental data can include a current ambient temperature, an outdoor temperature, a precipitation amount, a precipitation type, a weather forecast, and any other environmental information that affects utilization and/or operating conditions of battery 106. State of charge program 112 also receives historical data for battery 106 from database 114, where the historical data includes operational information associated a point in time for battery 106. The historical information can include battery 106 usage information, electronic device associated with battery 106 usage information, and any operational information associated with a point in time for battery 106.

Based on the received battery data, environment data, and historical data for battery 106, state of charge program 112 determines whether to activate a storage protocol for battery 106. Responsive to state of charge program 112 determining to activate the storage protocol for battery 106, state of charge program 112 initiates the storage protocol for battery 106 by discharging battery 106 to a preset state of charge level for storage. State of charge program 112 provides state of charge status to a user via user interface 118 on client device 104, where the user has the ability to reset the storage protocol. In other embodiments, state of charge program 112 has the ability to adjust the state of charge of battery 106 by utilizing multiple preset state of charge levels for storage based on a current ambient temperature in which battery 106 resides. For example, if state of charge program 112 detects an increase in the ambient temperature, state of charge program 112 can adjust to a lower state of charge level (e.g., 10%) for battery 106 compared to a higher state of charge level (e.g., 20%) for a lower ambient temperature.

Database 114 is a repository that stores battery data, environmental data, and historical date for battery 106. In the depicted embodiment, database 114 resides on server computer 102. In another embodiment, database 114 may reside on client device 104 or elsewhere within the distributed data processing environment provided state of charge program 112 has access to database 114. A database is an organized collection of data. Database 114 can be implemented with any type of storage device capable of storing data and configuration files that can be accessed and utilized by state of charge program 112, such as a database server, a hard disk drive, or a flash memory.

User interface 118 enables a user to make requests of or issue commands to client device 104 and receive information and instructions in response. In one embodiment, a user of client device 104 accesses user interface 118 via voice commands in natural language. In one embodiment, user interface 118 may be a graphical user interface (GUI) or a web user interface (WUI) and can display text, documents, web browser windows, user options, application interfaces, and instructions for operation, and include the information (such as graphic, text, and sound) that a program presents to a user and the control sequences the user employs to control the program. In another embodiment, user interface 118 may also be mobile application software. In an example, mobile application software, or an "app," is a computer program designed to run on smart phones, tablet computers and other mobile devices. User interface 118 enables a user of client device 104 to interact with each instance of state of charge program 112.

Figure 2:
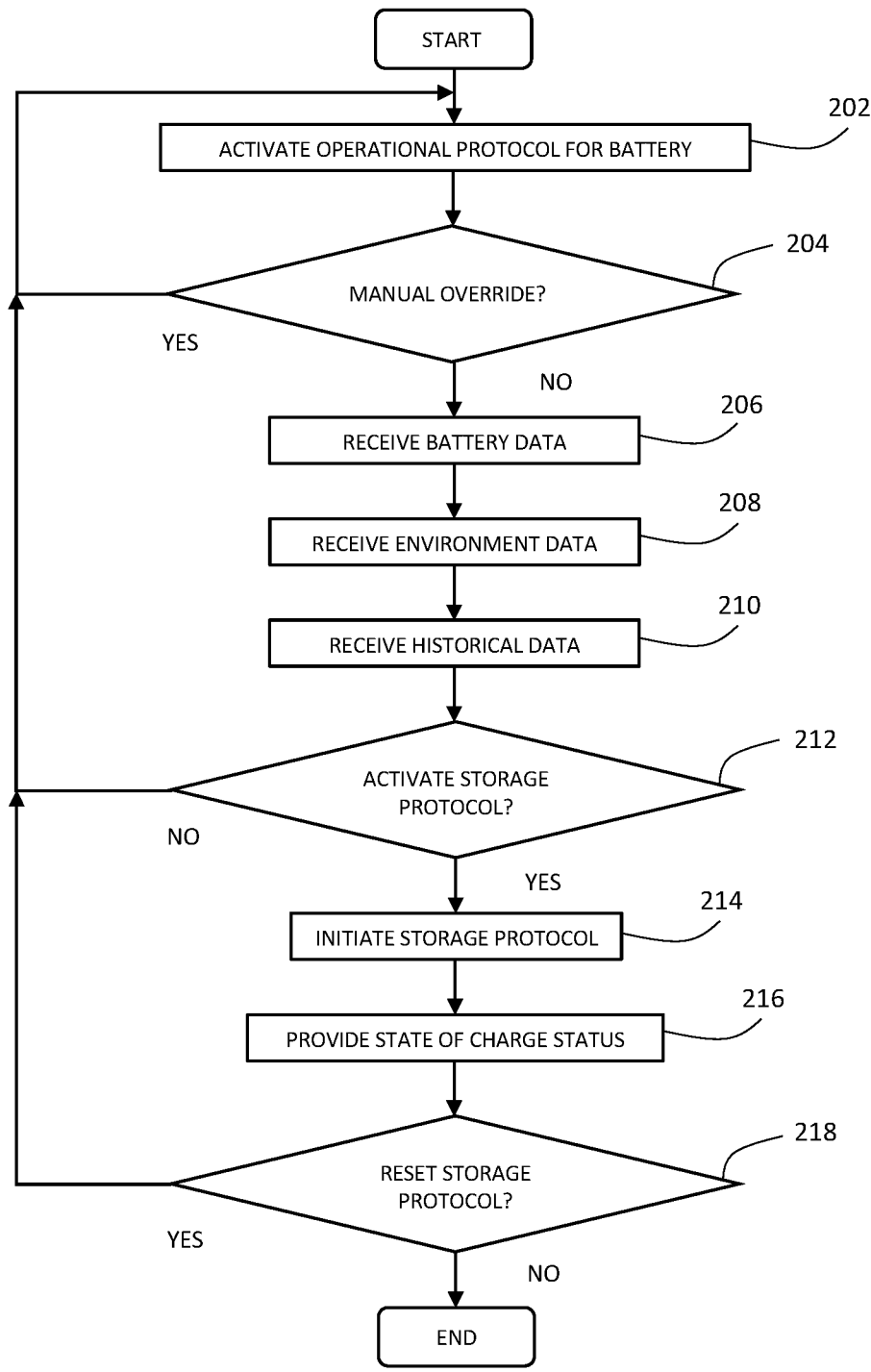
FIG. 2 is a flowchart depicting operational steps of a state of charge program for managing a state of charge level for extended storage of a battery, in accordance with an embodiment of the present invention.

FIG. 2 is a flowchart depicting operational steps of a state of charge program for managing a state of charge level for extended storage of a battery, in accordance with an embodiment of the present invention.

State of charge program 112 activates an operational protocol for a battery (202). In this embodiment, the operational protocol represents a normal operational mode of a rechargeable battery for charging and discharging a load into an associated electronic device. The rechargeable battery communicates to a battery charger through a broader network connection and/or a local network connection (e.g., Wi-Fi, Bluetooth®). As previously discussed, state of charge program 112 can operate directly on the battery charger and can communicate with the rechargeable battery through the broader network connection and/or local network connection. Alternatively, state of charge program 112 can operate on a server computer and can communicate with the rechargeable battery and the battery charger through the broader network. For the operational protocol where the rechargeable battery is loose and not electrically coupled to the electronic device and/or battery charger, the rechargeable battery maintains a charge for future discharging into the associated electronic device. For the operational protocol where the rechargeable battery is electrically coupled to the battery charge, the rechargeable battery can charge to reach a full state of charge (i.e., 100%) and maintain the charge for future discharging into the associated electronic device. For the operational protocol where the rechargeable battery is electrically coupled to the electronic device, the rechargeable battery can maintain a charge and/or discharge the load into the associated electronic device.

State of charge program 112 determines whether a user defined manual override for a storage protocol is active (decision 204). State of charge program 112 allows for the user to bypass initiating the storage protocol in the event the user expects to utilize the electronic device associated with the rechargeable battery. State of charge program 112 stores the user defined manual override indefinitely or for a predetermined amount of time (e.g., one week, one month), to prevent the initiation of the storage protocol for the rechargeable battery. In the event state of charge program 112 determines the user defined manual override for the storage protocol is not active ("no" branch, decision 204), state of charge program 112 receives battery data (206) to determine whether to initial a storage protocol for the battery. In the event state of charge program 112 determines the user defined manual override for the storage protocol is active ("yes" branch, decision 204, state of charge program 112 reverts to activating and maintaining the operational protocol for the battery.

State of charge program 112 receives battery data (206). In this embodiment state of charge program 112 received battery data from a database, the rechargeable battery, and/or the battery charger. The battery data can include but is not limited to a battery type, an electronic device (e.g., laptop, seasonal equipment, residential power storage) associated with the battery, age of battery, a number of charge cycles, and one or more manufacturer handling instructions (e.g., avoid storage temperatures below 30° F. and exceeding 90° F.). In one example, state of charge program 112 receives battery data indicating a rechargeable battery module is two years old, has gone through 85 charge cycles, and is associated with a residential power storage system. Furthermore, the manufacturer handling instructions recommend the rechargeable battery module not fall below a state of charge equaling 10% to preserve a longevity of the rechargeable battery module and to maintain a charge of no more than 40% if the residential power storage system is not utilized for an extended period of time (e.g., 30 days).

In another example, state of charge program 112 receives battery data indicating a rechargeable battery is a year old, has gone through 30 charge cycles, and is associated with a digital single-lens reflex (DSLR) camera. Furthermore, the manufacturer handling instructions recommend the rechargeable battery not fall below a state of charge equaling 5% to preserve longevity, to maintain a charge of no more than 50% if not utilized for an extend period of time (e.g., 3 days), and to avoid a high state of charge (e.g., >90%) for ambient temperatures greater than 90° F. In yet another example, state of charge program 112 receives battery data indicating a rechargeable battery is five years old, has gone through 425 charge cycles, and is associated with seasonal farming equipment. Furthermore, the manufacturer handling instructions recommend the rechargeable battery not fall below a state of charge equaling 15% to preserve longevity, to maintain a charge of no more than 30% if not utilized for an extend period of time (e.g., 15 days) in ambient temperatures below 32° F., and to maintain a charge of no more than 20% if not utilized for an extend period of time (e.g., 15 days) in ambient temperatures at or above 32° F.

State of charge program 112 receives environmental data (208). In this embodiment, state of charge program 112 receives environmental data from a database, the rechargeable battery, the battery charger, and/or one or more public available resources for providing environment related data. The environmental data can include a current ambient temperature, an outdoor temperature, a precipitation amount, a precipitation type, a weather forecast, and any other environmental information that affects utilization and/or operating conditions of the rechargeable battery. The environmental data allows for state of charge program 112 to determine, based on a correlation, whether current and predicated environmental impact how a rechargeable battery is currently being utilized and will be utilized in the future. The environmental data also indicates to state of charge program 112 how rechargeable battery is to be stored based on any manufacturer handling instructions received in (206). In the example where the rechargeable battery module is associated with the residential power storage system, state of charge program 112 receives environmental data that includes a current and predicted outdoor temperature and current weather conditions and predicted weather conditions. The predicted temperature and the predicted weather conditions can be based on a forecast from a publicly available resource or based on average temperature and weather conditions for a given location of the rechargeable battery module associated with the residential power storage system.

In the example where the rechargeable battery is associated with the DSLR camera, state of charge program 112 receives environmental data includes an ambient temperature for an environment in which the rechargeable battery and associated electronic device (i.e., DSLR camera) reside. State of charge program 112 can receive the ambient temperature value from temperature sensor on the rechargeable battery, the electronic device, and/or the battery charger. If the battery is not electrically coupled to the associated electronic device or battery charger (i.e., loose), state of charge program 112 can receive the ambient temperature value from a temperature sensor on the battery. If the battery is electrically coupled to the associated electronic device, state of charge program 112 can receive the ambient temperature value from a temperature sensor on the associated electronic device. If the battery is electrically coupled to the battery charger, state of charge program 112 can receive the ambient temperature value from a temperature sensor on the battery charger. In the example where the rechargeable battery is associated with seasonal farming equipment, state of charge program 112 receives environmental data that includes current weather conditions, predicted weather conditions, current precipitation levels, precipitation type, and predicted precipitation levels. The environmental data can indicate to state of charge program 112 whether there is an active drought, whether there is an active harvesting season, and whether there is an active planting season.

State of charge program 112 receives historical data (210). In this embodiment, state of charge program 112 receives historical data relating to the rechargeable battery and the battery charger from a database. The historical information can include the rechargeable battery usage information, electronic device associated with the rechargeable battery usage information, and any operational information associated with a point in time for the rechargeable battery. In the example where the rechargeable battery module is associated with the residential power storage system, state of charge program 112 receives usage information for the residential power storage system associated with the rechargeable battery module indicating the residential power storage systems is not utilized during the winter season. As a result, the rechargeable battery module for the residential power system may be charged but not discharged during the winter season. In the example where the rechargeable battery is associated with the DSLR camera, state of charge program 112 receives rechargeable battery usage information that indicates if that rechargeable battery is electrically coupled to the battery charger for greater than a predetermined amount of time (e.g., 72 hours), the rechargeable battery is subsequently not utilized for at least a historically based amount of time (e.g., 3 weeks). In the example where the rechargeable battery is associated with seasonal farming equipment, state of charge program 112 receives historical data that includes rechargeable battery usage information and seasonal farming equipment usage information, indicating which days of the year the rechargeable battery was utilized and charged and which days of the year the seasonal farming equipment was utilized.

State of charge program 112 determines whether to activate a storage protocol for the battery (decision 212). Based on an analysis of the battery data, environmental data, and the historical data, state of charge program 112 determined whether to activate the storage protocol of the rechargeable battery to preserve a life of the rechargeable battery. In the event state of charge program 112 determines to activate the storage protocol for the battery ("yes" branch, decision 212), state of charge program 112 initiates the storage protocol (214). In the event state of charge program 112 determines not to active the storage protocol for the battery ("no" branch, decision 212), state of charge program 112 reverts to activating and maintaining the operational protocol for the battery.

In the example where the rechargeable battery module is associated with the residential power storage system, state of charge program 112 analyzes the battery data, the environmental data, and historical data to determine if state of charge program 112 should initiate a storage protocol for the rechargeable battery module. In this example, state of charge program 112 determines to initiate the storage protocol based on environmental data with predicted weather conditions indicating temperatures below a threshold (e.g., 32° F.) and historical data indicating the rechargeable battery module is not utilized during the winter season. In the example where the rechargeable battery is associated with the DSLR camera, state of charge program 112 analyzes the battery data, the environmental data, and historical data to determine if state of charge program 112 should initiate a storage protocol for the rechargeable battery. In this example, state of charge program 112 determines to initiate the storage protocol based on historical data that indicates if the rechargeable battery has been electrically coupled for greater than the predetermined time (e.g., 72 hours), the rechargeable battery is subsequently not utilized for at least a historically based amount of time (e.g., 3 weeks). In the example where the rechargeable battery is associated with seasonal farming equipment, state of charge program 112 analyzes the battery data, the environmental data, and historical data to determine if state of charge program 112 should initiate a storage protocol for the rechargeable battery. In this example, state of charge program 112 determines to initiate the storage protocol based on environmental data that does not indicate a harvesting season nor indicate a planting season and historical data indicating which days of the year the rechargeable battery was utilized and charged and which days of the year the seasonal farming equipment was utilized.

State of charge program 112 initiates the storage protocol (214). For a storage protocol where the rechargeable battery is loose and not electrically coupled to the electronic device and/or battery charger, state of charge program 112 instructs the rechargeable battery via the battery charger to discharge to a preset state of charge level. For a storage protocol where the rechargeable battery is electrically coupled to the battery charger, state of charge program 112 instructs the battery charger to discharge the rechargeable battery to a preset state of charge level. In another embodiment, state of charge program 112 instructs the rechargeable battery to discharge to a preset state of charge, even when the rechargeable battery is electrically coupled to the battery charger. State of charge program 112 can instruct the battery charger to maintain the preset state of charge level as part of the storage protocol, since charge dissipation of the rechargeable battery can occur during extended storage. For the storage protocol where the rechargeable battery is electrically coupled to the electronic device, state of charge program 112 instructs the rechargeable battery to discharge to the preset state of charge level. In some embodiments, state of charge program 112 can send a notification to the user regarding the discharging event, along with one or more recommendations to utilize the rechargeable battery to avoid energy waste. As a result, state of charge program 112 can receive a user provided allocation of the energy (i.e., charge) scheduled to be discharged with the storage protocol, where one or more consumer devices (e.g., appliances, air conditioning unit, charging devices) of the electronic device (e.g., residential power storage system) associated with the rechargeable battery can utilize the charge until the preset state of charge level is reached.

In the example where the rechargeable battery module is associated with the residential power storage system, state of charge program 112 initiates the storage protocol by discharging the rechargeable battery module until the state of charge reaches the preset state of charge level of 40%. As discussed above, state of charge program 112 can discharge the rechargeable battery module via an allocation to one or more consumer devices provided by the user. In the example where the rechargeable battery associated with the DSLR camera, state of charge program 112 initiates the storage protocol by discharging the rechargeable battery until the state of charge reaches a preset state of charge level of 50%. In the example where the rechargeable battery is associated with seasonal farming equipment, state of charge program 112 initiates the storage protocol by discharging the rechargeable battery until the state of charge reaches a first preset state charge of level of 30% if the temperature is below a predetermined level (e.g., <32° F.). If state of charge program 112 subsequently determines the temperature is at or above the predetermined level (e.g., ≥32° F.), state of charge program 112 discharges the rechargeable battery until the state of charge reaches a second preset state charge of level of 20%.

State of charge program 112 provides a state of charge status (216). State of charge program 112 provides a state of charge status to a client device associated with a user. State of charge program 112 allows for the user to monitor the discharging of the rechargeable battery and provides an option for the user to pause, reverse, and/or resume the discharging of the rechargeable battery based on the storage protocol. Furthermore, state of charge program 112 allows for the user to reset the storage protocol for the rechargeable battery, where state of charge program 112 provides an option in the user interface on the client device for resetting the storage protocol and/or directly on the battery charger. The battery charger can include a physical button and/or switch for resetting the storage protocol for the rechargeable battery.

State of charge program 112 determines whether to reset the storage protocol for the battery (decisions 218). In the event state of charge program 112 determines to reset the storage protocol for the battery ("yes" branch, decision 218), state of charge program 112 reverts to reverts to activating and maintaining the operational protocol for the battery (202). In the event state of charge program 112 determines not to reset the storage protocol for the battery ("no" battery, decision 218), state of charge program 112 ceases operations until the rechargeable battery electrically coupled to a battery charger. In some embodiments, even if the rechargeable battery is electrically coupled to the battery charger, state of charge program 112 can prevent the rechargeable battery from entering the operational protocol from the storage proctor until the user provides an input (e.g., selection via the user interface on the client device).

Figure 3:
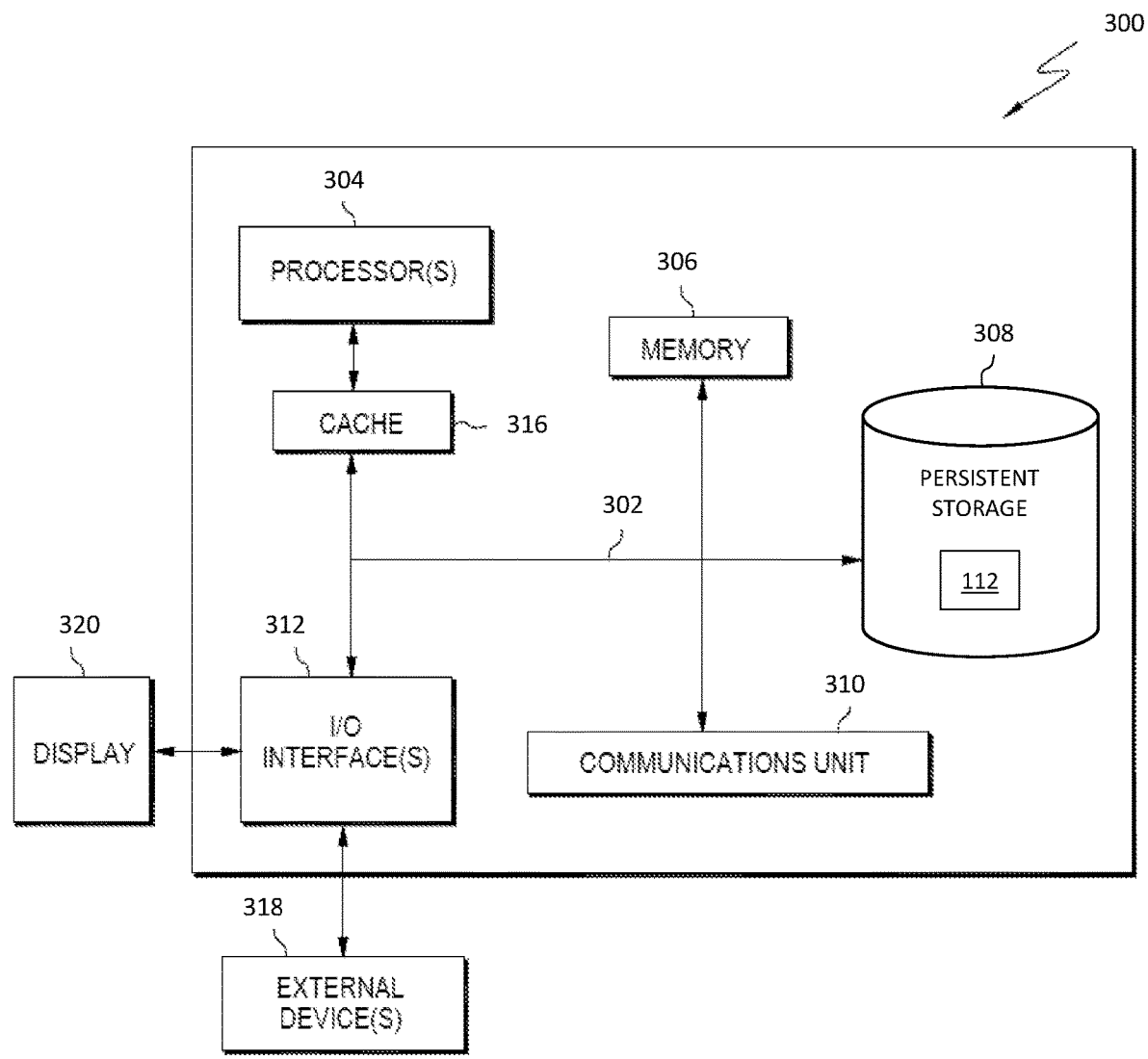
FIG. 3 is a block diagram of components of a computer system, such as the server computer of FIG. 1, in accordance with an embodiment of the present invention.

FIG. 3 depicts computer system 300, where server computer 102 is an example of a computer system 300 that includes state of charge program 112. The computer system includes processors 304, cache 316, memory 306, persistent storage 308, communications unit 310, input/output (I/O) interface(s) 312 and communications fabric 302. Communications fabric 302 provides communications between cache 316, memory 306, persistent storage 308, communications unit 310, and input/output (I/O) interface(s) 312. Communications fabric 302 can be implemented with any architecture designed for passing data and/or control information between processors (such as microprocessors, communications and network processors, etc.), system memory, peripheral devices, and any other hardware components within a system. For example, communications fabric 302 can be implemented with one or more buses or a crossbar switch.

Memory 306 and persistent storage 308 are computer readable storage media. In this embodiment, memory 306 includes random access memory (RAM). In general, memory 306 can include any suitable volatile or non-volatile computer readable storage media. Cache 316 is a fast memory that enhances the performance of processors 304 by holding recently accessed data, and data near recently accessed data, from memory 306.

Program instructions and data used to practice embodiments of the present invention may be stored in persistent storage 308 and in memory 306 for execution by one or more of the respective processors 304 via cache 316. In an embodiment, persistent storage 308 includes a magnetic hard disk drive. Alternatively, or in addition to a magnetic hard disk drive, persistent storage 308 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 308 may also be removable. For example, a removable hard drive may be used for persistent storage 308. Other examples include optical and magnetic disks, thumb drives, and smart cards that are inserted into a drive for transfer onto another computer readable storage medium that is also part of persistent storage 308.

Communications unit 310, in these examples, provides for communications with other data processing systems or devices. In these examples, communications unit 310 includes one or more network interface cards. Communications unit 310 may provide communications through the use of either or both physical and wireless communications links. Program instructions and data used to practice embodiments of the present invention may be downloaded to persistent storage 308 through communications unit 310.

I/O interface(s) 312 allows for input and output of data with other devices that may be connected to each computer system. For example, I/O interface 312 may provide a connection to external devices 318 such as a keyboard, keypad, a touch screen, and/or some other suitable input device. External devices 318 can also include portable computer readable storage media such as, for example, thumb drives, portable optical or magnetic disks, and memory cards. Software and data used to practice embodiments of the present invention can be stored on such portable computer readable storage media and can be loaded onto persistent storage 308 via I/O interface(s) 312. I/O interface(s) 312 also connect to display 320.

Display 320 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 4:
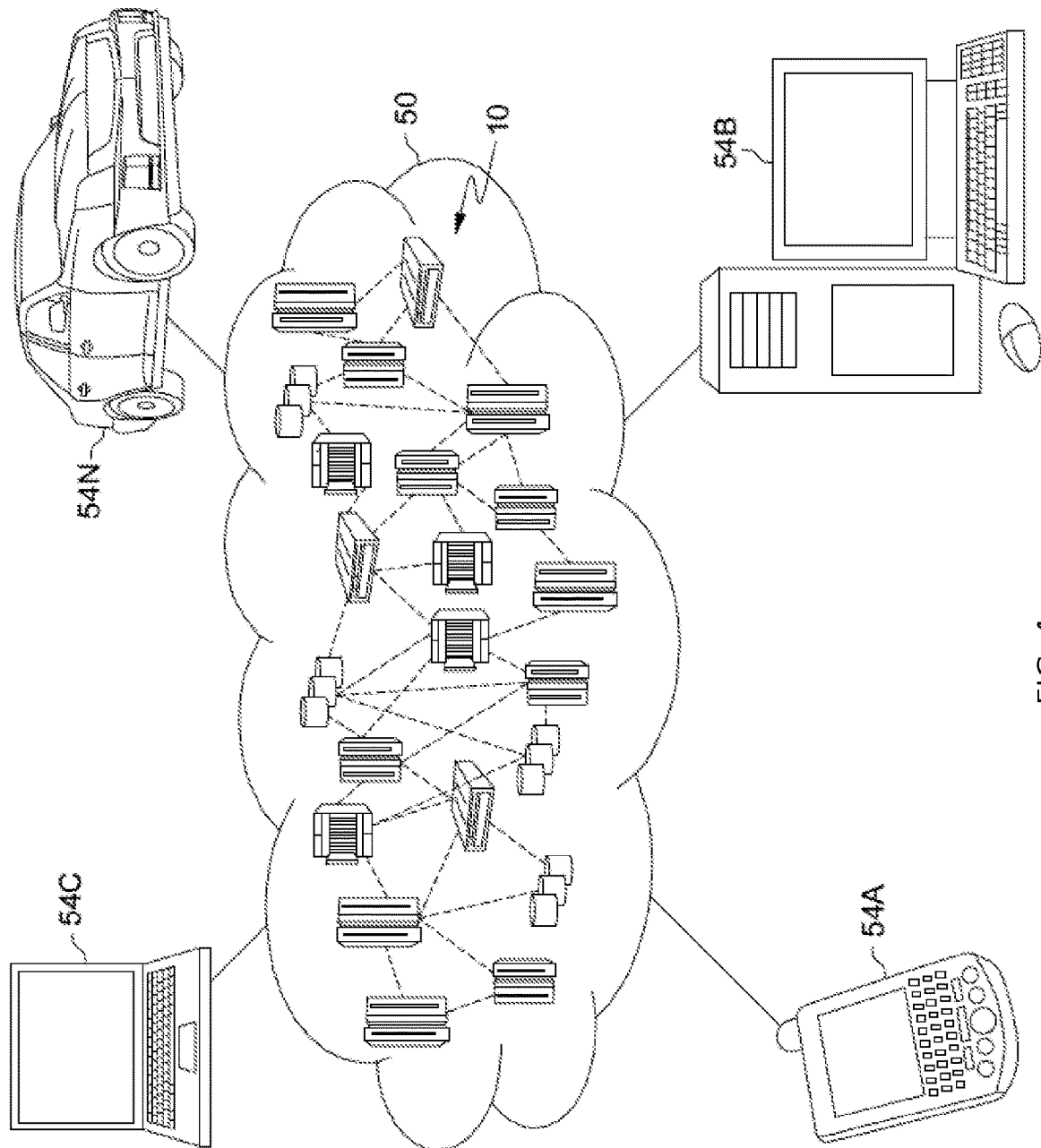
FIG. 4 depicts a cloud computing environment, in accordance with an embodiment of the present invention.

Referring now to FIG. 4, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 4 are intended to be illustrative only and that computing nodes 10 and cloud computing environment 50 can communicate with any type of computerized device over any type of network and/or network addressable connection (e.g., using a web browser).

Figure 5:
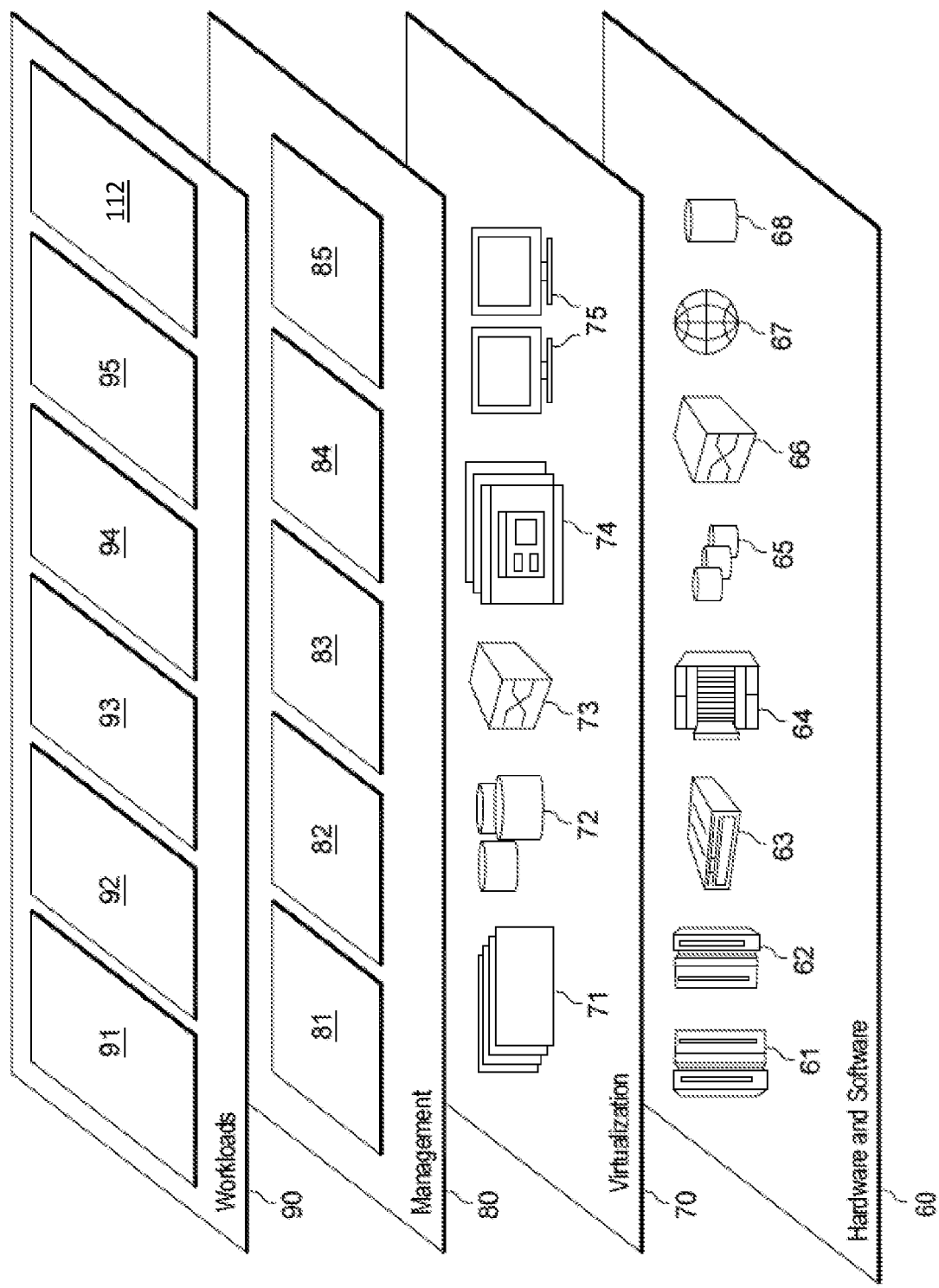
FIG. 5 depicts abstraction model layers, in accordance with an embodiment of the present invention.

Referring now to FIG. 5, a set of functional abstraction layers provided by cloud computing environment 50 (FIG. 4) is shown. It should be understood in advance that the components, layers, and functions shown in FIG. 5 are intended to be illustrative only and embodiments of the invention are not limited thereto. As depicted, the following layers and corresponding functions are provided:

Hardware and software layer 60 include hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and state of charge program 112.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method comprising:
   determining a manual override for a storage protocol is not activate between a rechargeable battery and a battery charger, wherein the rechargeable battery is associated with the battery charger through a network connection;
   receiving battery data for the rechargeable battery
   receiving environment data for the rechargeable battery;
   receiving historical data for the rechargeable battery; and
   determining to activate the storage protocol for the rechargeable battery based on the battery data, the environment data, and the historical data;
   instructing the rechargeable battery, via the battery charger through the network connection, to discharge to a preset state of charge level based on the storage protocol.

2. The computer-implemented method of claim 1, further comprising:
   determining the rechargeable battery is not electrically coupled to either the battery charger or an electronic device; and
   determining to discharge the rechargeable battery to the preset state of charge level based on the storage protocol.

3. The computer-implemented method of claim 1, further comprising:
   determining the rechargeable battery is electrically coupled to the battery charger; and
   determining to discharge the rechargeable battery to the preset state of charge level based on the storage protocol.

4. The computer-implemented method of claim 1, further comprising:
   determining the rechargeable battery is electrically coupled to an electronic device; and
   determining to discharge the rechargeable battery to the preset state of charge level based on the storage protocol.

5. The computer-implemented method of claim 4, further comprising:
   receiving a user provided allocation of charge to one or more consumer devices of the electronic device coupled to the rechargeable battery; and
   discharging a load from the rechargeable battery to the one or more consumer devices of the electronic device based on the user provided allocation of charge.

6. The computer-implemented method of claim 1, further comprising:
   responsive to determining the rechargeable battery is electrically coupled to the battery charger, preventing the battery charger from providing a charge to the rechargeable battery; and
   responsive to receiving a user input to reset the storage protocol, activating an operation protocol for the rechargeable battery, wherein the battery charger can provide the charge to the rechargeable battery.

7. The computer-implemented method of claim 1, wherein the storage protocol indicates the preset state of charge level for the rechargeable battery based on the battery data and the environment data.

8. The computer program product of claim 1, wherein the storage protocol indicates the preset state of charge level for the rechargeable battery based on the battery data and the environment data.

9. A computer program product comprising one or more computer readable storage media and program instructions collectively stored on the one or more computer readable storage media, the stored program instructions executable by one or more computer processors, the stored program instructions comprising:

program instructions to determine a manual override for a storage protocol is not activate between a rechargeable battery and a battery charger, wherein the rechargeable battery is associated with the battery charger through a network connection;

program instructions to receive battery data for the rechargeable;

program instructions to receive environment data for the rechargeable battery;

program instructions to receive historical data for the rechargeable battery; and program instructions to determine to activate the storage protocol for the rechargeable battery based on the battery data, the environment data, and the historical data;

program instructions to instruct the rechargeable battery, via the battery charger through the network connection, to discharge to a preset state of charge level based on the storage protocol.

10. The computer program product of claim 9, the stored program instructions further comprising:

program instructions to determine the rechargeable battery is not electrically coupled to either the battery charger or an electronic device; and program instructions to determine to discharge the rechargeable battery to the preset state of charge level based on the storage protocol.

11. The computer program product of claim 9, the stored program instructions further comprising:

program instructions to determine the rechargeable battery is electrically coupled to the battery charger; and program instructions to determine to discharge the rechargeable battery to the preset state of charge level based on the storage protocol.

12. The computer program product of claim 9, the stored program instructions further comprising:

program instructions to determine the rechargeable battery is electrically coupled to an electronic device; and program instructions to determine to discharge the rechargeable battery to the preset state of charge level based on the storage protocol.

13. The computer program product of claim 12, the stored program instructions further comprising:

program instructions to receive a user provided allocation of charge to one or more consumer devices of the electronic device coupled to the rechargeable battery; and program instructions to discharge a load from the rechargeable battery to the one or more consumer devices of the electronic device based on the user provided allocation of charge.

14. The computer program product of claim 9, the stored program instructions further comprising:

program instructions to, responsive to determining the rechargeable battery is electrically coupled to the battery charger, prevent the battery charger from providing a charge to the rechargeable battery; and program instructions to, responsive to receiving a user input to reset the storage protocol, activate an operation protocol for the rechargeable battery, wherein the battery charger can provide the charge to the rechargeable battery.

15. A computer system comprising:
one or more computer processors;
one or more computer readable storage media; and program instructions stored on the computer readable storage media for execution by at least one of the one or more computer processors, the program instructions comprising:

program instructions to determine a manual override for a storage protocol is not activate between a rechargeable battery and a battery charger, wherein the rechargeable battery is associated with the battery charger through a network connection;

program instructions to receive battery data for the rechargeable;

program instructions to receive environment data for the rechargeable battery;

program instructions to receive historical data for the rechargeable battery; and program instructions to determine to activate the storage protocol for the rechargeable battery based on the battery data, the environment data, and the historical data;

program instructions to instruct the rechargeable battery, via the battery charger through the network connection, to discharge to a preset state of charge level based on the storage protocol.

16. The computer system of claim 15, the stored program instructions further comprising:

program instructions to determine the rechargeable battery is not electrically coupled to either the battery charger or an electronic device; and program instructions to determine to discharge the rechargeable battery to the preset state of charge level based on the storage protocol.

17. The computer system of claim 15, the stored program instructions further comprising:

program instructions to determine the rechargeable battery is electrically coupled to the battery charger; and program instructions to determine to discharge the rechargeable battery to the preset state of charge level based on the storage protocol.

18. The computer system of claim 15, the stored program instructions further comprising:

program instructions to determine the rechargeable battery is electrically coupled to an electronic device; and program instructions to determine to discharge the rechargeable battery to the preset state of charge level based on the storage protocol.

19. The computer system of claim 18, the stored program instructions further comprising:

program instructions to receive a user provided allocation of charge to one or more consumer devices of the electronic device coupled to the rechargeable battery; and program instructions to discharge a load from the rechargeable battery to the one or more consumer devices of the electronic device based on the user provided allocation of charge.

20. The computer system of claim 15, the stored program instructions further comprising:

program instructions to, responsive to determining the rechargeable battery is electrically coupled to the battery charger, prevent the battery charger from providing a charge to the rechargeable battery; and program instructions to, responsive to receiving a user input to reset the storage protocol, activate an operation protocol for the rechargeable battery, wherein the battery charger can provide the charge to the rechargeable battery.

\* \* \* \* \*